(12) United States Patent
Son et al.

(10) Patent No.: US 12,169,211 B2
(45) Date of Patent: Dec. 17, 2024

(54) VERTICAL PROBE PIN AND A PROBE CARD HAVING SAME

(71) Applicant: TSE CO., LTD., Chungcheongnam-do (KR)

(72) Inventors: Seok Ho Son, Gyeonggi-do (KR); Young Hun Ju, Gyeonggi-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 159 days.

(21) Appl. No.: 18/004,758

(22) PCT Filed: Jul. 7, 2021

(86) PCT No.: PCT/KR2021/008616
§ 371 (c)(1),
(2) Date: Jan. 9, 2023

(87) PCT Pub. No.: WO2022/010246
PCT Pub. Date: Jan. 13, 2022

(65) Prior Publication Data
US 2023/0258691 A1    Aug. 17, 2023

(30) Foreign Application Priority Data
Jul. 9, 2020    (KR) ........................ 10-2020-0084463

(51) Int. Cl.
*G01R 1/073*    (2006.01)
*G01R 1/067*    (2006.01)
(52) U.S. Cl.
CPC ..... *G01R 1/07357* (2013.01); *G01R 1/06716* (2013.01)

(58) Field of Classification Search
USPC ..................................................... 324/755.06
See application file for complete search history.

(56) References Cited

U.S. PATENT DOCUMENTS 10,670,628 B2    6/2020    Park
10,845,385 B2    11/2020    Lee et al.
(Continued)

FOREIGN PATENT DOCUMENTS

KR    10-2014-0059896 A    5/2014
KR    10-1785591 B1    10/2017
(Continued)

OTHER PUBLICATIONS

International Search Report dated Oct. 15, 2021 out of PCT Priority Application PCT/KR2021/008616 (7 pages including English translation).
(Continued)

*Primary Examiner* — Farhana A Hoque
(74) *Attorney, Agent, or Firm* — Crowell & Moring LLP; John C. Freeman

(57) ABSTRACT

A vertical probe pin that includes: an elastic beam part which is disposed between a lower contact portion in contact with a device to be tested and an upper contact point spaced apart at a predetermined distance from the lower contact point and in contact with a test device. The vertical probe pin is composed of a pair of elastic beams having a predetermined gap in order to be elastically deformed by an external force; and a separation prevention protrusion part provided with separation prevention protrusions protruding from at least one of the pair of elastic beams in order to prevent the elastic beam part from being separated through an upper guide hole.

10 Claims, 7 Drawing Sheets

(56) References Cited

U.S. PATENT DOCUMENTS

2014/0103945 A1* 4/2014 Eid .................. G01N 27/041
                                                     324/693
2019/0041428 A1   2/2019 Park
2019/0377003 A1  12/2019 Lee et al.

FOREIGN PATENT DOCUMENTS

| KR | 10-2018-0052314 A | 5/2018 |
| KR | 10-2019-0014863 A | 2/2019 |
| KR | 10-2062670 B1 | 1/2020 |
| KR | 10-2145398 B1 | 8/2020 |

OTHER PUBLICATIONS

Written Opinion dated Oct. 15, 2021 out of PCT Priority Application PCT/KR2021/008616 (3 pages in Korean text).

* cited by examiner

VERTICAL PROBE PIN AND A PROBE CARD HAVING SAME

This application is a national filing of Patent Cooperation Treaty Patent Application No. PCT/KR2021/008616, filed on Jul. 7, 2021, the entire contents of which is incorporated herein by reference.

This application claims under 35 U.S.C. § 119 (a) the benefit of the filing date of Korean Patent Application No. 10-2020-0084463, filed on Jul. 9, 2020, the entire contents of which are incorporated herein by reference.

TECHNICAL FIELD

The present invention relates to a vertical probe pin and a probe card with the same, and more particularly, to a vertical probe pin that prevents the vertical probe pin stored in the probe card from being separated from the probe card and falling, and a probe card with the same.

BACKGROUND ART

In general, a probe card is basically a device effective for electrically connecting a plurality of contact pads of a device under test with a corresponding channel of a testing device that performs testing.

The inspection performed on the device under test is to detect and isolate faulty or defective elements already in the manufacturing stage. Therefore, a probe card is generally used to electrically inspect an electronic element integrated on a semiconductor or a silicon wafer by contact before cutting the semiconductor or silicon wafer and assembling the semiconductor or the silicon wafer into a chip package.

A probe card is largely classified into cantilever type and vertical type according to its structure, and the vertical type probe card includes a lower plate and an upper plate in the form of a plate supporting both ends of vertical probe pin. Both ends of the vertical probe pin are inserted into and coupled to guide holes formed in the lower plate and the upper plate. In the case that the terminal of the object to be inspected is pressed against the contact tip of the vertical probe pin, the vertical probe pin is moved in each guide hole, and the elastically deformed portion of the vertical probe pin is deformed.

However, in the conventional vertical probe card, there has been a problem that, in the case that the upper guide is turned over to withdraw the vertical probe pin from each guide for maintenance, the vertical probe pin is separated from the upper guide hole and falls.

In addition, there has been a problem that, in the case that a vertical probe pin embedded in the probe card is damaged by an external impact, the damaged vertical probe pin is separated from the lower plate and falls, causing damage to the device under test.

SUMMARY OF THE INVENTION

This invention has been made to solve the above conventional problems, and an objective of the present invention is to provide a vertical probe pin and a probe card with the same that prevent a vertical probe pin stored in a probe card from being separated from the probe card and falling.

In order to achieve the above objective, a vertical probe pin according to the present invention includes: an elastic beam part which is disposed between a lower contact portion in contact with a device to be tested and an upper contact point spaced apart at a predetermined distance from the lower contact point and in contact with a test device, and is composed of a pair of elastic beams having a predetermined gap in order to be elastically deformed by an external force, in a probe pin used in a probe card including a probe pin sequentially coupled to an upper plate having at least one upper guide hole and a lower plate having at least one lower guide hole; and a separation prevention protrusion part provided with separation prevention protrusions protruding from at least one of the pair of elastic beams in order to prevent the elastic beam part from being separated through an upper guide hole, wherein the elastic beam part is formed so that in the case of being inserted through the upper guide hole, the gap between the pair of elastic beams is reduced by being elastically deformed by the force generated by the contact between the separation prevention protrusion and the upper guide hole, and in the state of being inserted and coupled through the upper guide hole, the distance between the pair of elastic beams including the separation prevention protrusion is greater than the diameter of the upper guide hole.

In addition, a probe card according to the present invention includes: a lower plate having at least one lower guide hole; an upper plate having a upper guide hole that is installed apart from the lower plate and corresponds to the lower guide hole; a probe pin having an elastic beam part which is disposed between a lower contact portion in contact with a device to be tested and an upper contact point spaced apart at a predetermined distance from the lower contact point and in contact with a test device, and is composed of a pair of elastic beams having a predetermined gap in order to be elastically deformed by an external force; and a separation prevention protrusion part provided with separation prevention protrusions protruding from at least one of the pair of elastic beams in order to prevent the elastic beam part from being separated through an upper guide hole, wherein the elastic beam part is in the case of being inserted through the upper guide hole, the gap between the pair of elastic beams is reduced by being elastically deformed by the force generated by the contact between the separation prevention protrusion and the upper guide hole, and in the state of being inserted and coupled through the upper guide hole, the distance between the pair of elastic beams including the separation prevention protrusion is formed to be greater than the diameter of the upper guide hole.

A probe card according to the present invention has an effect of maximally preventing a plurality of vertical probe pins stored in the probe card from being separated from the probe card and falling even in the case that the probe card is turned over.

In addition, there is an effect of maximally preventing the vertical probe pin from being deformed or damaged because of the elastic deformation of the elastic beam part in the process of assembling the vertical probe pin having the separation prevention protrusion on the upper plate.

In addition, in the case that the vertical probe pin is damaged by an external impact, there is an effect of preventing the broken vertical probe pin from falling through the lower guide hole.

DETAILED DESCRIPTION OF THE INVENTION

Figure 1:
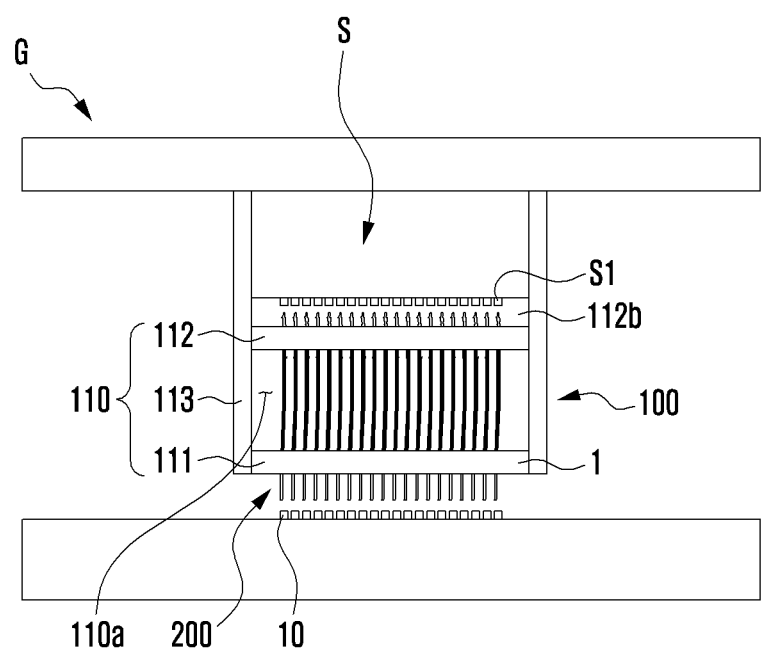
FIG. 1 is a diagram schematically illustrating the structure of a probe card according to an embodiment of the present invention.

Hereinafter, a preferred embodiment according to the present invention will be described in detail with reference to the accompanying drawings. At this time, it should be noted that in the accompanying drawings, the same components are indicated by the same reference numerals as much as possible. And detailed descriptions of well-known functions and configurations that may obscure the gist of the present invention will be omitted.

Hereinafter, a probe card according to an embodiment of the present invention will be described with reference to the accompanying drawings, FIGS. 1 to 7.

Figure 2:
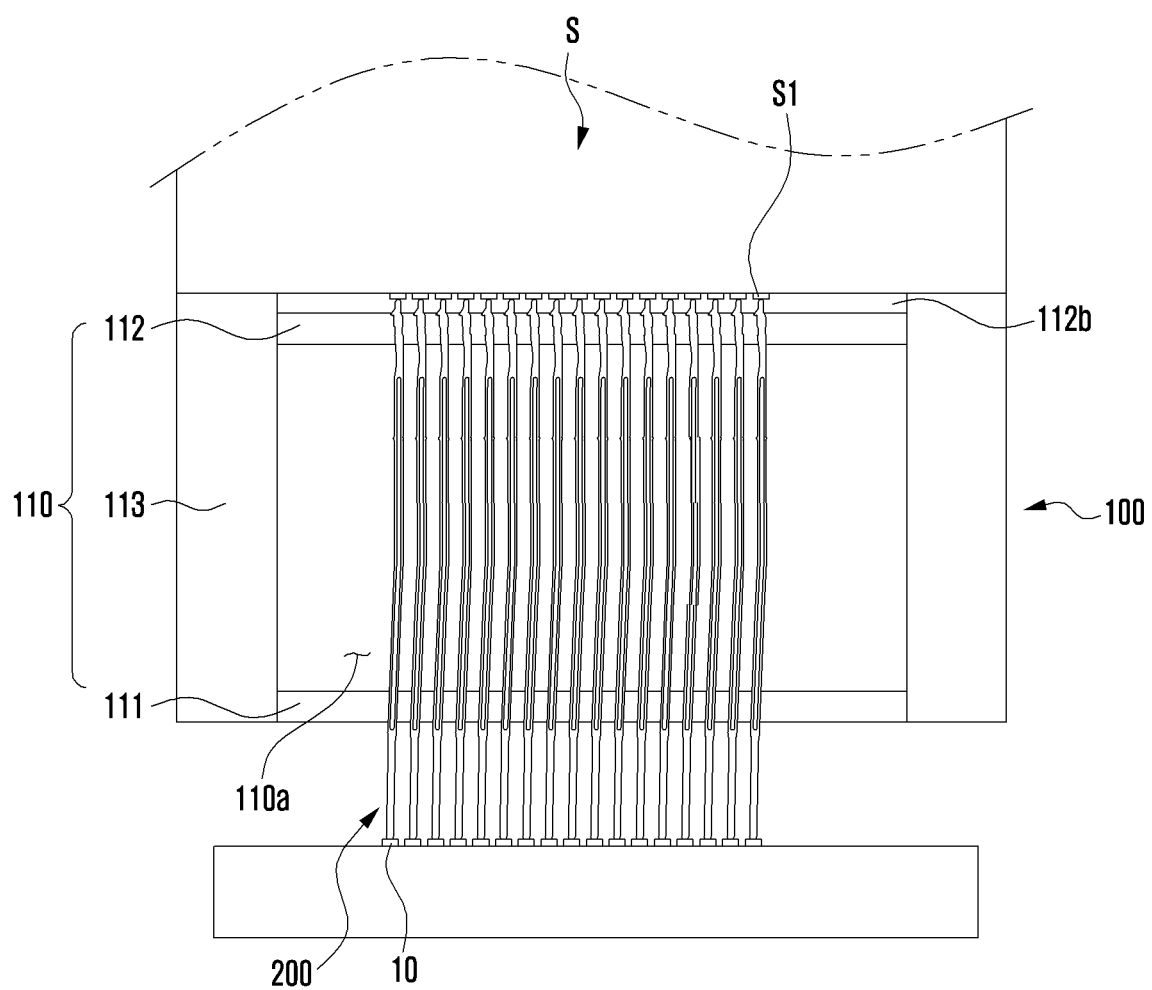
FIG. 2 is a diagram schematically illustrating a state in which a probe card is operated according to an embodiment of the present invention.
Figure 3:
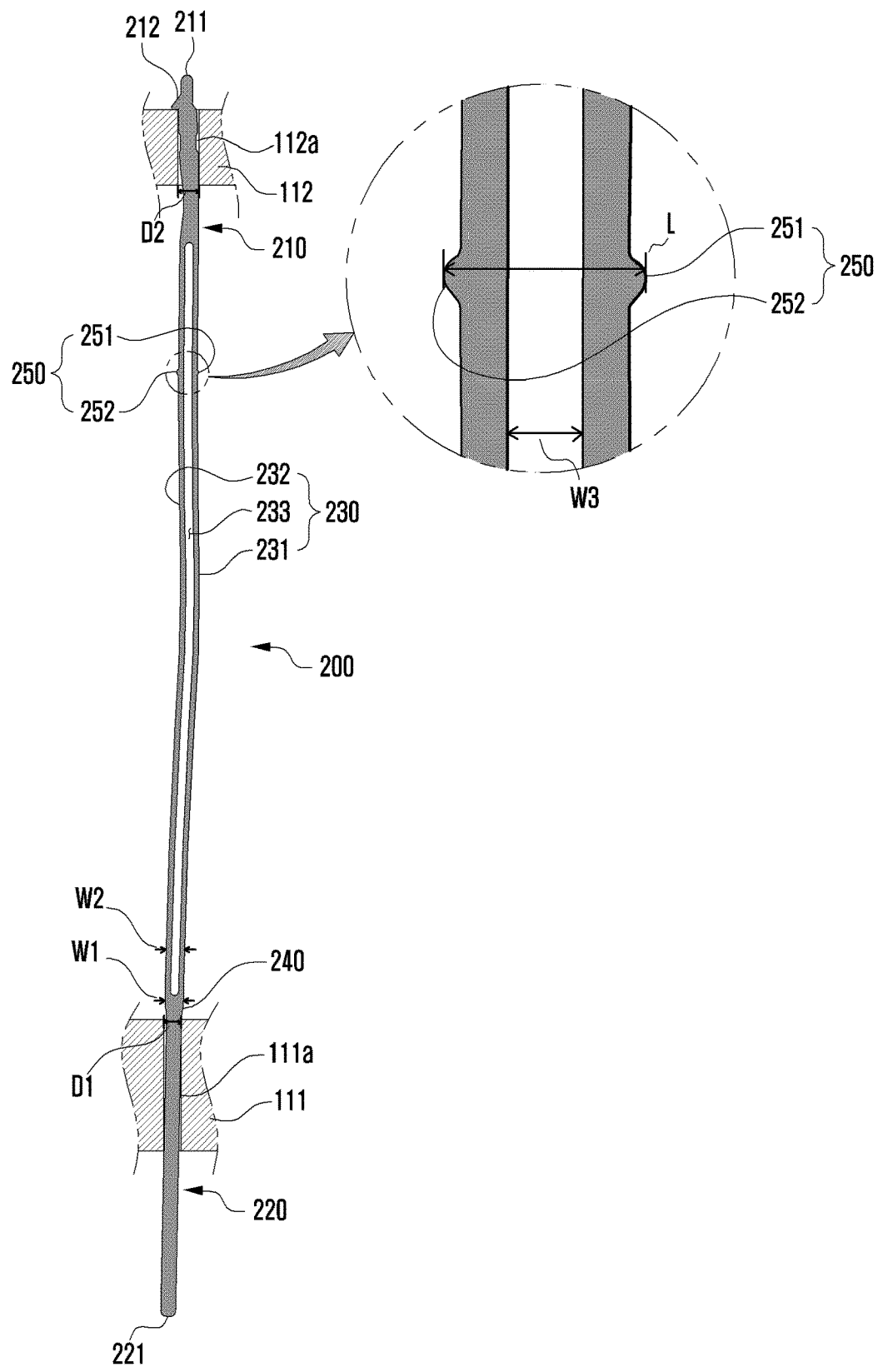
FIG. 3 is a cross-sectional view illustrating a state in which a vertical probe pin is coupled to an upper plate and a lower plate according to an embodiment of the present invention.

FIG. 1 is a diagram schematically illustrating the structure of a probe card according to an embodiment of the present invention, FIG. 2 is a diagram schematically illustrating a state in which the probe card is operated according to an embodiment of the present invention, and FIG. 3 is a cross-sectional view illustrating a state in which a vertical probe pin is coupled to the upper plate and the lower plate according to an embodiment of the present invention.

Figure 4:
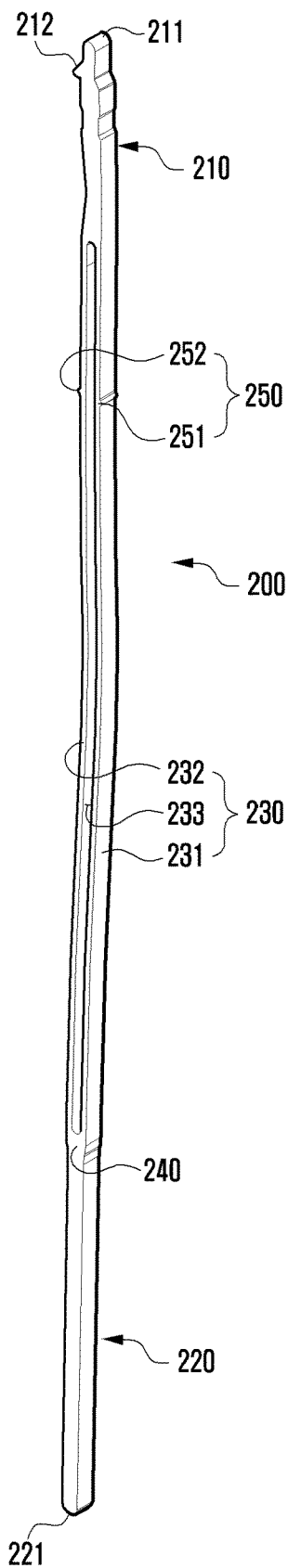
FIG. 4 is a perspective view illustrating the structure of a probe pin according to an embodiment of the present invention.
Figure 5:
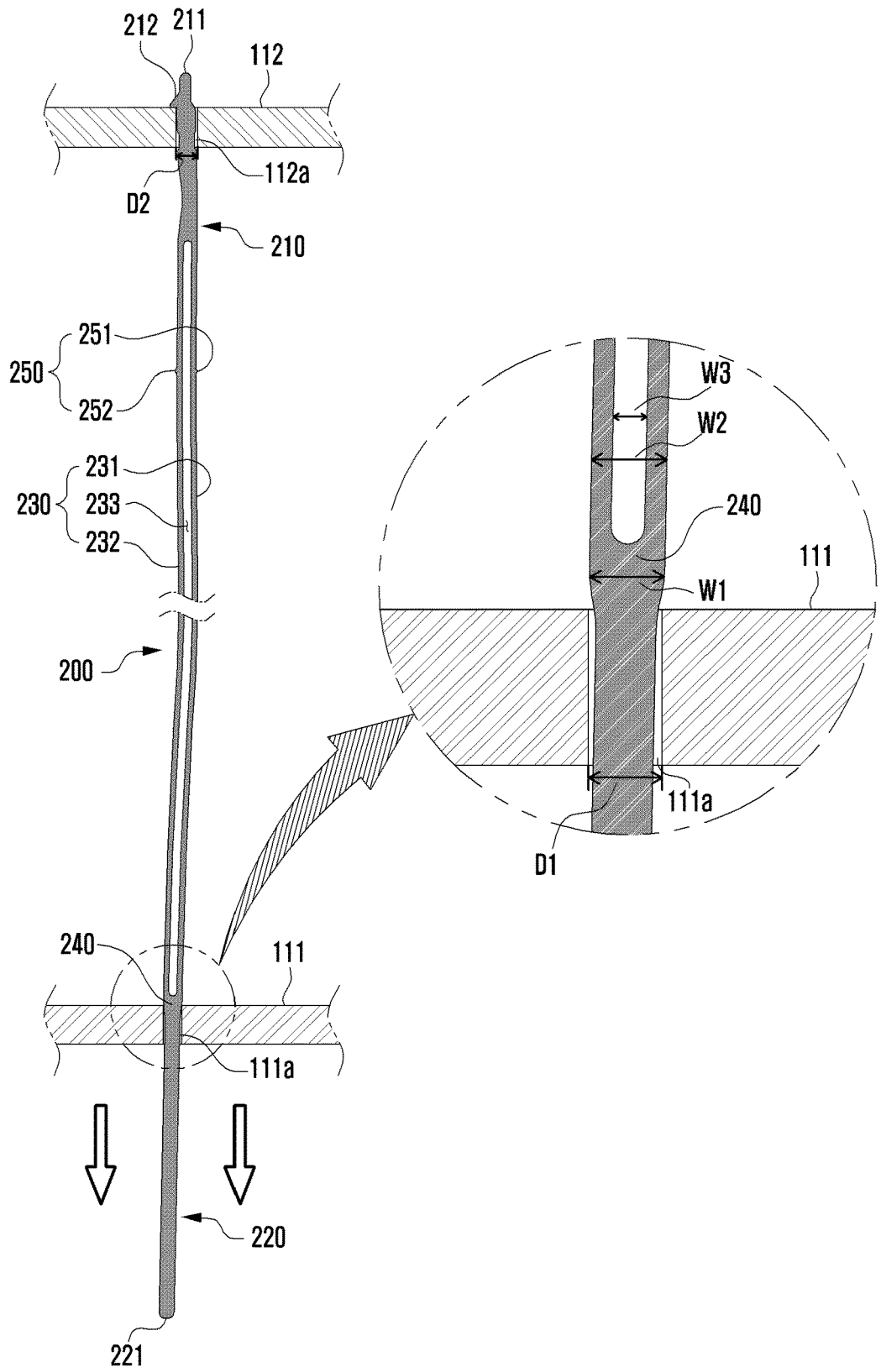
FIG. 5 is a diagram illustrating a structure in which a vertical probe pin damaged by an expansion part is prevented from falling according to an embodiment of the present invention.
Figure 6:
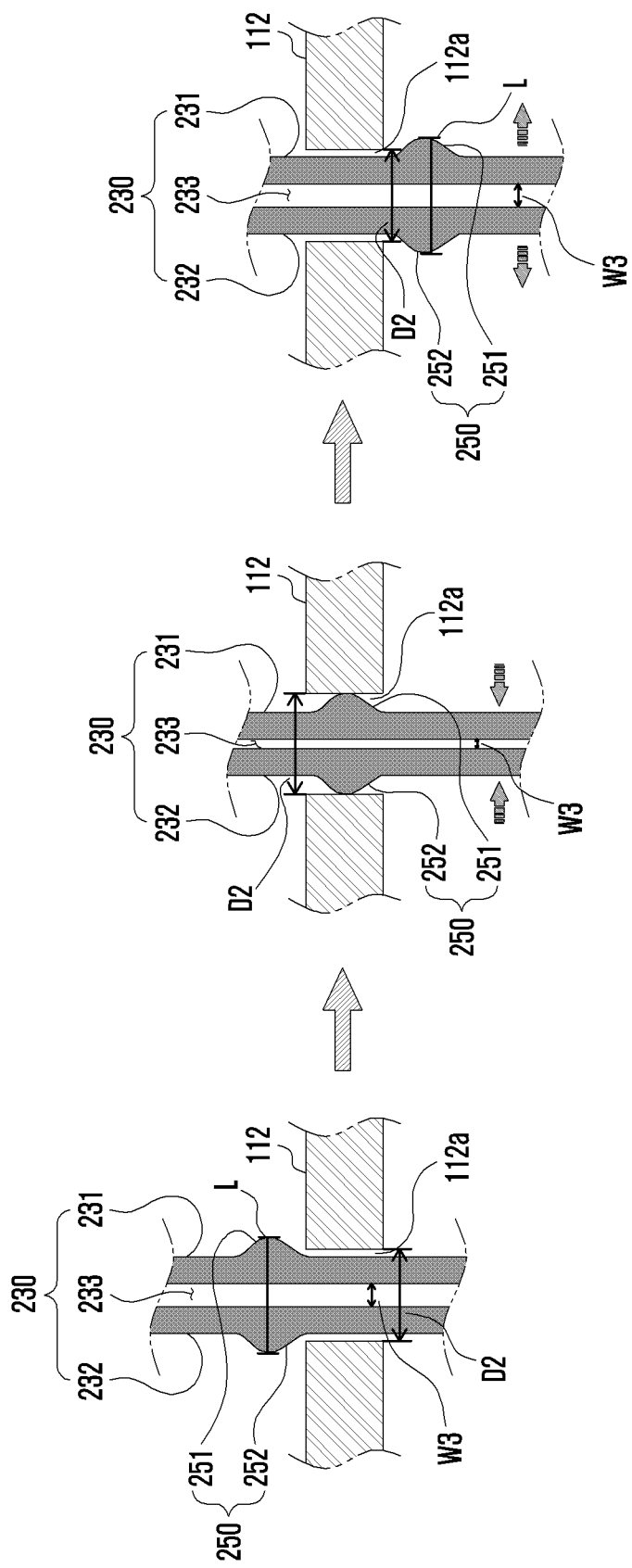
FIG. 6 is a diagram illustrating a process in which a separation prevention protrusion passes through an upper plate according to an embodiment of the present invention.
Figure 7:
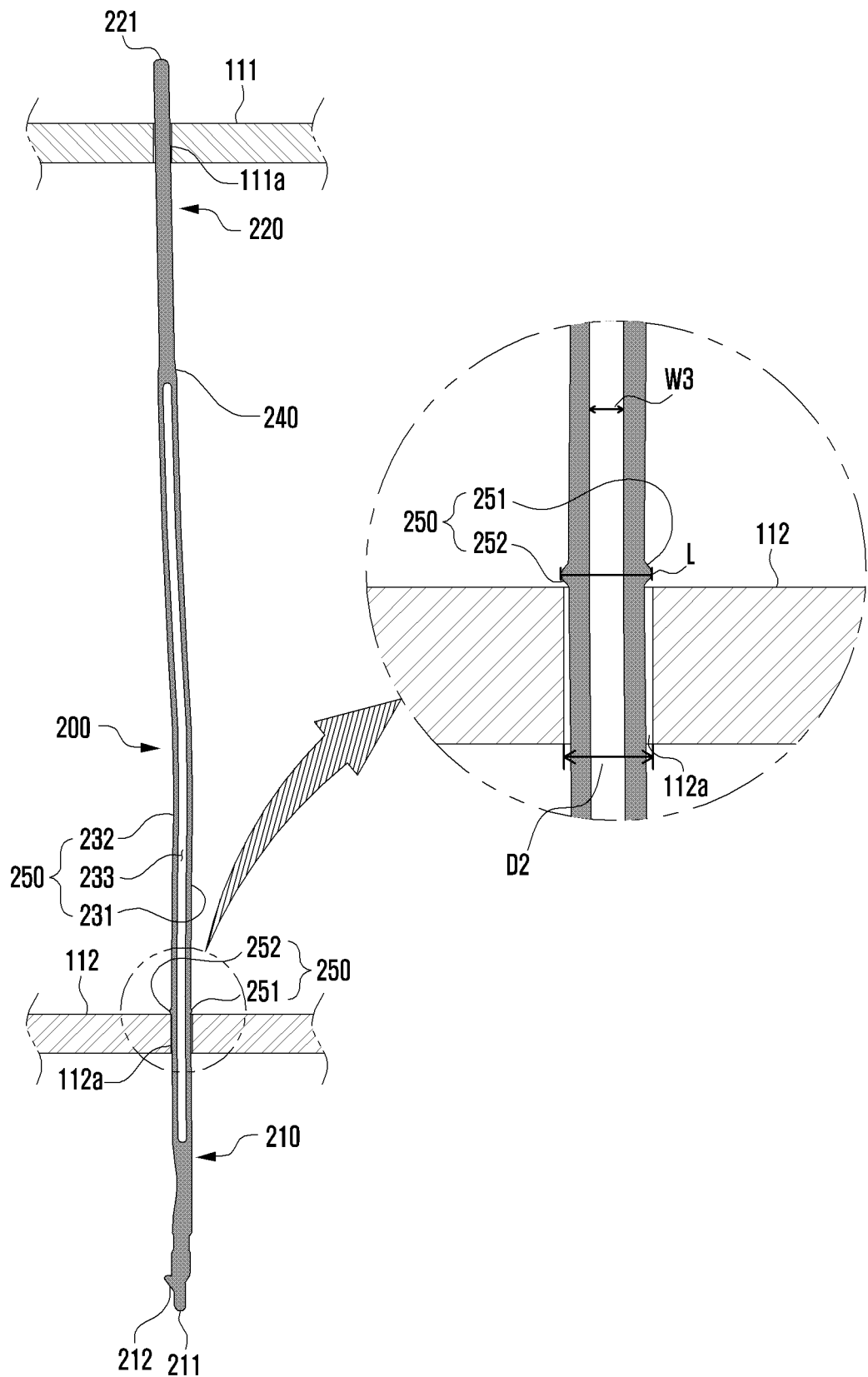
FIG. 7 is a diagram illustrating a structure in which a vertical probe pin does not fall through an upper guide hole by using a separation prevention protrusion according to an embodiment of the present invention.

And FIG. 4 is a perspective view illustrating the structure of a probe pin according to an embodiment of the present invention, FIG. 5 is a diagram illustrating a structure in which a vertical probe pin damaged by an expansion part is prevented from falling according to an embodiment of the present invention, FIG. 6 is a diagram illustrating a process in which a separation prevention protrusion passes through an upper plate according to an embodiment of the present invention, and FIG. 7 is a diagram illustrating a structure in which a vertical probe pin does not fall through an upper guide hole by using a separation prevention protrusion according to an embodiment of the present invention.

With reference to FIG. 1 and FIG. 2, a probe card according to an embodiment of the present invention is a card for performing an inspection of a device under test 10, and the probe card may include a printed circuit board G and a probe 100.

The printed circuit board G may include a circuit transmitting the signal transmitted from the probe 100 to the semiconductor inspection device in a reverse direction, simultaneously with receiving an electrical signal transmitted from a device inspection device (not shown) and transferring it to the probe 100.

The probe 100 according to an embodiment of the present invention may be connected to a lower portion of a printed circuit board G or a space transformer S connected to a lower surface of the printed circuit board G.

At this time, the probe 100 performs a role of transmitting an electrical signal to the device under test 10 contacted through a plurality of vertical probe pins 200 protruding vertically, and in response to this, the probe 100 transmits the received electrical signal to the upper printed circuit board G in the reverse direction.

Recently, because the device under test 10 is formed in a fine structure, the spacing of the plurality of vertical probe pins 200 must be finely arranged. In this case, a space transformer S providing electrical connection between the printed circuit board G and the probe 100 may be disposed to convert the pitch of the dense vertical probe pins 200 as needed.

A plurality of contact pads Si to which vertical probe pins 200 are electrically connected may be provided on the bottom surface of the space transformer S.

Hereinafter, with reference to FIG. 2 to FIG. 7, the probe 100 mounted on the bottom surface of the space transformer S among the probe cards according to an embodiment of the present invention will be mainly described.

With reference to FIG. 2 and FIG. 3, the probe 100 according to an embodiment of the present invention may include a body part 110 mounted on the bottom of the space transformer S and at least one vertical probe pin 200 mounted inside the body part 110.

The body part 110 may be disposed at an upper position of the device under test 10, and the body part 110 may include a lower plate 111, an upper plate 112, and a vertical support 113.

The lower plate 111 may be formed in a plate shape having a certain thickness and disposed at an upper position of the device under test 10, and at least one lower guide hole 111a may be formed at a position in the lower plate 111 corresponding to the contact surface of the device under test 10.

The lower guide hole 111a may be formed in the form of a through hole vertically penetrating the lower plate 111, and a part of the lower side of the vertical probe pin 200 to be described later is exposed to the lower end of the lower guide hole 111a, and it is in contact with the upper surface of the device under test 10.

The upper plate 112 may be formed in a plate shape having a certain thickness in the same manner as the lower plate 111 and disposed apart from the lower plate 111, and at least one upper guide hole 112a may be formed at a position corresponding to at least one guide hole 111a formed on the lower plate 111.

Like the lower guide hole 111a, the upper guide hole 112a may be formed in the form of a through hole vertically penetrating the upper plate 112, and a portion of the upper side of the vertical probe pin 200 may be exposed to the upper side of the upper guide hole 112a and be contacted to the contact pad Si mounted on the space transformer S.

At this time, the vertical probe pin 200 may be inserted through the upper guide hole 112a in a downward direction and sequentially pass through the lower guide hole 111a to be stored in the main body 110.

The vertical support 113 is disposed on the lateral of the lower plate 111 and the upper plate 112 and maintains a gap between the lower plate 111 and the upper plate 112, thereby an inner space 110a may be formed between the lower plate 111 and the upper plate 112.

The vertical support 113 may be supported by being coupled to the lower part of the space transformer S.

An upper space 112b may be formed between the upper surface of the upper plate 112 and the lower surface of the space transformer S, and the upper space 112b may enable the upper part of the vertical probe pin 200 to rise in the vertical direction in accordance with the upward movement of the device under test 10. At this time, the upper space 112b can be adjusted by the height difference between the upper surface of the upper plate 112 and the upper surface of the vertical support 113.

On the other hand, an inner space 110a may be formed between the lower surface of the upper plate 112 and the upper surface of the lower plate 111, and the inner space 110a may enable an elastic beam part 230 of the vertical probe pin 200 disposed in the inner space 110a to exert elastic force by the force applied to the vertical probe pin 200 in accordance with the upward movement of the device under test 10.

With reference to FIG. 4, the vertical probe pin 200 according to an embodiment of the present invention may include a lower contact part 220 contacting the device under test 10, an upper contact part 210 contacting the contact pad Si of the space transformer S and an elastic beam part 230 disposed between the lower contact part 220 and the upper contact part 210.

The upper contact part 210 may be formed extending from an upper end of the elastic beam part 230, and an upper contact tip 211 may be provided at the upper end. At this time, a portion of the upper contact part 210 may be disposed in a state of passing through the upper guide hole 112a of the upper plate 112, and the upper contact tip 211 may be in contact with the contact pad Si of the space transformer S during device inspection and may connect electrically the device under test 10 and the vertical probe pin 200 to the printed circuit board G.

On the other hand, in the upper contact part 210, an upper protrusion 212 protruding from the exposed portion of the upper guide hole 112a of the upper contact part 210 and disposed so as to be caught on the upper surface of the upper plate 112 on which the upper guide hole 112a is formed, may be provided.

The upper protrusion 212 may prevent the upper contact part 210 from falling downward after being separated from the upper guide hole 112a in a state that the vertical probe pin 200 is mounted on the body part 110.

The lower contact part 220 may be formed extending from the lower end of the elastic beam part 230, and a lower contact tip 221 may be provided at the lower end.

At this time, a portion of the lower contact part 220 may be disposed in a state of passing through the lower guide hole 111a of the lower plate 111, and the lower contact tip 221 may be in contact with the device under test 10 during device inspection and may connect electrically the device under test 10 and the vertical probe pin 200.

On the other hand, with reference to FIG. 5, the width W1 of the lower contact part 220 is formed larger than the diameter D1 of the lower guide hole 111a, but an expansion part 240 formed equal to the overall width W2 of the elastic beam part 230, may be provided.

More specifically, the expansion part 240 may be formed at the portion where the upper end of the lower contact part 220 and the elastic beam part 230 are connected, and it may prevent the low contact part 220, disposed in the lower guide hole 111a, from being separated from the lower guide hole 111a.

For example, as shown in FIG. 5, in the case that the vertical probe pin 200 is damaged by an external impact, the broken portion of the vertical probe pin 200 falls through the lower guide hole 111a and the device under test 10 becomes damaged. At this time, because the width W1 of the expansion part 240 is larger than the diameter D1 of the lower guide hole 111a, it serves as a stopper to prevent the broken vertical probe pin 200 from falling. Accordingly, it is possible to prevent the damaged vertical probe pin 200 from falling, thereby preventing damage to the device under test 10.

The elastic beam part 230 according to an embodiment of the present invention may be composed of a pair of elastic beams having a predetermined gap and may be elastically deformed so that a gap formed between the pair of elastic beams is reduced by an external force. At this time, the elastic beam part 230 may pass through the upper guide hole 112a and be disposed in the inner space 110a formed between the upper plate 112 and the lower plate 111. The elastic beam part 230 may include a first elastic beam 231, a second elastic beam 232 and an elastic gap 233.

One end of the first elastic beam 231 may be connected to one side of the lower end of the upper contact part 210 and the other end may be connected to one side of the upper end of the lower contact part 220, and one end of the second elastic beam 232 may be connected to the other side of the lower end of the upper contact part 210 and the other end may be connected to the other side of the upper end of the lower contact part 220 while the second elastic beam 232 is spaced apart at a predetermined distance from the first elastic beam 231.

An elastic gap 233 having a predetermined width is formed between the first elastic beam 231 and the second elastic beam 232 spaced apart.

An elastic beam part 230 will be described in detail along with a separation prevention protrusion part 250 to be described below.

The separation prevention protrusion part 250 according to an embodiment of the present invention may include a separation prevention protrusion protruding from at least one elastic beam of the pair of elastic beams 231 and 232, and it may be formed protruding from the outer side of the elastic beam part 230 and prevent the vertical probe pin 200 from being separated and falling through the upper guide hole 112a.

The separation preventing protrusion part 250 may include a first separation prevention protrusion 251 and a second separation prevention protrusion 252 each of which is protruding from the pair of elastic beams 231 and 232.

The first separation prevention protrusion 251 may protrude from the outer side of the first elastic beam 231 in a horizontal direction, and the second separation prevention protrusion 252 may protrude in the opposite direction of the first separation prevention protrusion 251 while protruding from the outer side of the second elastic beam 232.

On the other hand, it is preferable that the first separation prevention protrusion 251 and the second separation prevention protrusion 252 are formed at positions facing each other, but is not limited thereto.

At this time, it is preferable that the length L between one end of the first separation prevention protrusion 251 and one end of the second separation prevention protrusion 252 is formed to be larger than the diameter D2 of the upper guide hole not to be separated through the upper guide hole.

Therefore, the separation prevention protrusion part 250 can pass through the upper guide hole 112a by the width W3 of the elastic gap 233 reduced by the elastic deformation of the pair of elastic beams 231 and 232, and the separation prevention protrusion part 250 passing through the upper guide hole 112a prevents the vertical probe pin 200 from being separated and falling through the upper guide hole 112a by being caught on the bottom surface of the upper plate 112 by the width W3 of the elastic gap 233 restored by the elastic restoring force of the elastic beam part 230.

With reference to FIGS. 6 and 7, the operation of the separation prevention protrusion part 250 will be described in detail.

As shown in FIG. 6, in the course of the elastic beam part 230 having the separation prevention protrusion part 250 passing through the upper guide hole 112a, an elastic deformation may occur reducing the width of the elastic gap 233 formed between the first elastic beam 231 and the second elastic beam 232, in the case that the first separation prevention protrusion 251 and the second separation prevention protrusion 252 are in contact with the inside of the upper guide hole 112a while passing through the upper guide hole 112a.

At this time, the first separation prevention protrusion 251 and the second separation prevention protrusion 252 may pass through the upper guide hole 112a without deformation or damage by the elastic deformation of the first elastic beam 231 and the second elastic beam 232 where the width W3 of the elastic gap 233 is reduced.

In the first separation prevention protrusion 251 and the second separation prevention protrusion 252 passing through the upper guide hole 112a, as the width W3 of the elastic gap 233 formed between the first elastic beam 231 and the second elastic beam 232 is restored, the length L between the first separation prevention protrusion 251 and the second separation prevention protrusion 252 becomes greater than the diameter D2 of the upper guide hole 112a.

Accordingly, as shown in FIG. 7, in the case that the main body 110 of the probe card is separated from the space transformer S for maintenance or the upper plate 112 is turned over to withdraw the vertical probe pin 200 from the main body 110, the first separation prevention protrusion 251 and the second separation prevention protrusion 252 may prevent the vertical probe pin 200 stored in the main body 110 from being separated and falling by being caught on the bottom surface of the upper plate 112.

As described above, the probe card according to the present invention can maximally prevent a plurality of vertical probe pins stored in the probe card from being separated from the probe card and falling even in the case that the probe card is turned over.

In addition, in the process of assembling the vertical probe pin having the separation prevention protrusion on the upper plate, deformation and damage of the vertical probe pin because of elastic deformation of the elastic beam part can be prevented as much as possible.

In addition, in the case that the vertical probe pin is damaged by an external impact, it is possible to prevent the broken vertical probe pin from falling through the lower guide hole.

Because various modifications may be made to the configurations and methods described and illustrated herein without departing from the scope of the present invention, all matters contained in the above detailed description or shown in the accompanying drawings are illustrative and not intended to limit the present invention. Accordingly, the scope of the present invention is not limited by the above-described exemplary embodiments and should be defined only in accordance with the following claims and equivalents thereof.

The invention claimed is:

1. A probe pin used in a probe card, which comprises the probe pin sequentially coupled to an upper plate comprising an upper guide hole and a lower plate comprising a lower guide hole, the probe pin comprising:
    an elastic beam part which is disposed between a lower contact part in contact with a device to be tested, and an upper contact part spaced apart at a predetermined distance from the lower contact part and in contact with a test device, and is composed of a pair of elastic beams separated from one another by a predetermined gap in order to be elastically deformed by an external force; and
    a separation prevention protrusion part comprising separation prevention protrusions protruding from at least one of the pair of elastic beams in order to prevent the elastic beam part from being separated through an upper guide hole of an upper plate,
    wherein the elastic beam part is formed so that in the case of being inserted through the upper guide hole, a gap of separation between the pair of elastic beams is reduced by being elastically deformed by a force generated by contact between the separation prevention protrusions and the upper guide hole, and in the state of being inserted and coupled through the upper guide hole, a distance between the pair of elastic beams, including the separation prevention protrusions, is greater than a diameter of the upper guide hole.

2. The probe pin of claim 1, wherein the elastic beam part comprises:
    a first elastic beam comprising one end connected to one side of the upper contact part and an other end connected to one side of the lower contact part;
    a second elastic beam disposed apart at a predetermined distance from the first elastic beam and comprising one end connected to an other side of the upper contact part and an other end connected to an other side of the lower contact part; and
    an elastic gap formed in a space separated between the first elastic beam and the second elastic beam.

3. The probe pin of claim 2, wherein the separation prevention protrusions comprise:
    a first separation prevention protrusion protruding in a horizontal direction from an outside of the first elastic beam; and
    a second separation prevention protrusion protruding in an opposite direction to the first separation prevention protrusion while protruding from an outer side of the second elastic beam.

4. The probe pin of claim 3, wherein the first separation prevention protrusion and the second separation prevention protrusion are formed at positions facing each other.

5. The probe pin of claim 1, wherein an expansion part having a width larger than a diameter of a lower guide hole of a lower plate is provided at a portion connected to the elastic beam part and the lower contact part, and the expansion part prevents the probe pin from falling through the lower guide hole in the case that the elastic beam part is damaged.

6. A probe card comprising:
    a lower plate having a lower guide hole;
    an upper plate having an upper guide hole that is installed apart from the lower plate and corresponds to the lower guide hole;
    a probe pin comprising:
        an elastic beam part which is disposed between a lower contact part in contact with a device to be tested and an upper contact part spaced apart at a predetermined distance from the lower contact part and in contact with a test device, and is composed of a pair of elastic beams separated from one another by a predetermined gap in order to be elastically deformed by an external force; and a separation prevention protrusion part comprising separation prevention protrusions protruding from at least one of the pair of elastic beams in order to prevent the elastic beam part from being separated through the upper guide hole, wherein when the elastic beam part is inserted through the upper guide hole, a gap of separation between the pair of elastic beams is reduced by being elastically deformed by a force generated by contact between the separation prevention protrusions and the upper guide hole, and in the state of being inserted and coupled through the upper guide hole, a distance between the pair of elastic beams, including the separation prevention protrusions, is formed to be greater than a diameter of the upper guide hole.

7. The probe card of claim 6, wherein the elastic beam part comprises:

a first elastic beam comprising one end connected to one side of the upper contact part and an other end connected to one side of the lower contact part;

a second elastic beam disposed apart at a predetermined distance from the first elastic beam and comprising one end connected to an other side of the upper contact part and an other end connected to an other side of the lower contact part; and an elastic gap formed in a space separated between the first elastic beam and the second elastic beam.

8. The probe card of claim 7, the separation prevention protrusions comprise:

a first separation prevention protrusion protruding in a horizontal direction from an outer side of the first elastic beam; and a second elastic beam protruding in an opposite direction to the first separation prevention protrusion while protruding from an outer side of the second elastic beam.

9. The probe card of claim 8, wherein the first separation prevention protrusion and the second separation prevention protrusion are formed at positions facing each other.

10. The probe card of claim 6, wherein an expansion part having a larger width than a diameter of the lower guide hole is provided at a portion connected to the elastic beam part and the lower contact part, and the expansion part prevents the probe pin from falling through the lower guide hole in the case that the elastic beam is damaged.

\* \* \* \* \*